United States Patent [19]

Danen et al.

[11] Patent Number: 5,266,132
[45] Date of Patent: Nov. 30, 1993

[54] ENERGETIC COMPOSITES

[75] Inventors: Wayne C. Danen, Los Alamos; Joe A. Martin, Espanola, both of N. Mex.

[73] Assignee: The United States of America as represented by the United States Department of Energy, Washington, D.C.

[21] Appl. No.: 774,961

[22] Filed: Oct. 8, 1991

[51] Int. Cl.$^5$ .............................................. C06B 45/14
[52] U.S. Cl. ........................................ 149/15; 149/37
[58] Field of Search ................................... 149/15, 37

[56] References Cited

U.S. PATENT DOCUMENTS

| | | | |
|---|---|---|---|
| 3,159,104 | 12/1964 | Hodgson | 149/15 |
| 3,163,113 | 12/1964 | Davis et al. | 149/15 |
| 3,503,814 | 3/1970 | Helms et al. | 149/15 |
| 3,523,839 | 8/1970 | Shechter et al. | 149/15 |
| 3,549,436 | 12/1970 | La Rocca | 149/15 |
| 3,995,559 | 12/1976 | Bice et al. | 149/15 |
| 4,464,989 | 8/1984 | Gibson et al. | 149/15 |
| 4,715,280 | 12/1987 | Wittwer | 102/202.8 |
| 4,824,495 | 4/1989 | Verneker | 149/15 |
| 4,976,200 | 12/1990 | Benson et al. | 102/202.7 |
| 5,090,322 | 2/1992 | Allford | 149/15 |

OTHER PUBLICATIONS

T. N. Taylor et al., "The Reaction of Vapor-Deposited Al With Cu Oxides," Abstract Amer. Vacuum Soc. 37th Annual Symposium, Toronto, Ontario, Oct. 8–12, 1990.

T. N. Taylor et al., "Reaction of Vapor-Deposited Aluminum With Copper Oxides," J. Vac. Sci. Technol. A 9 (3), pp. 1840–1846, May/Jun. (1991).

F. Bordeaus et al., "Ultra Rapid Heating by Spontaneous Mixing Reactions in Metal-Metal Multilayer Composites," J. Mater. Res., vol. 5, No. 8, pp. 1656–1661, (Aug. 1990).

Primary Examiner—Edward A. Miller
Attorney, Agent, or Firm—Richard J. Cordovano; Paul D. Gaetjens; William R. Moser

[57] ABSTRACT

A method for providing chemical energy and energetic compositions of matter consisting of thin layers of substances which will exothermically react with one another. The layers of reactive substances are separated by thin layers of a buffer material which prevents the reactions from taking place until the desired time. The reactions are triggered by an external agent, such as mechanical stress or an electric spark. The compositions are known as metastable interstitial composites (MICs). This class of compositions includes materials which have not previously been capable of use as energetic materials. The speed and products of the reactions can be varied to suit the application.

1 Claim, 2 Drawing Sheets

ENERGETIC COMPOSITES

BACKGROUND OF THE INVENTION

This invention relates to the fields of chemical reaction kinetics and energetic materials. This invention is the result of a contract with the Department of Energy (Contract No. W-7405-ENG-36).

A composition of this invention is termed a metastable interstitial composite (MIC). MICs are a new class of energetic materials which provide much more flexibility in their use than unimolecular energetic materials. MICs will be useful in explosives applications and in applications where a source of gas or heat is needed.

When a conventional explosive, or energetic material, is detonated, the atoms of each molecule of explosive rapidly rearrange to form gaseous products while releasing energy in the form of heat and shock. One condition for such a chemical reaction to take place is that the atoms of the reactants must be sufficiently close together so that they will interact with one another. In such a unimolecular reaction, the atoms of the molecule are sufficiently close to one another for the reaction to take place by virtue of being bound in a single molecule. There exist pairs of materials which react to release large amounts of energy, but the release is not sufficiently rapid for the materials to be useful as an explosive composition. On the other hand, there are applications for energetic materials where conventional explosives cannot be used because the reaction proceeds too quickly.

MICs can be designed for both fast and slow reactions. The present invention includes chemical reactions between substances which have not previously been useful in applications requiring energetic materials. The reactions take place between atoms which are not bound together in a single molecule, but which are disposed sufficiently close to one another so that rapid chemical reactions will take place. This is accomplished by use of a composite having thin layers of reactants which are separated by thin layers of a material referred to as a buffer which prevents the reaction from taking place until an external triggering stress is applied to initiate the reaction. In addition to MICs which can be designed such that the reactions proceed rapidly, MICs which react more slowly can be designed. In general, MICs can be designed to suit the application. For example, if the application requires heat but not gasses, the MIC can be so designed.

SUMMARY OF THE INVENTION

This invention is a method for providing chemical energy and energetic compositions of matter consisting of thin layers of substances which will exothermically react with one another. The layers of reactive substances are separated by thin layers of a buffer material which prevents the reactions from taking place until the desired time. The reactions are triggered by an external agent, such as mechanical stress or an electric spark. The compositions are known as metastable interstitial composites (MICs). This class of compositions includes materials which have not previously been capable of use as energetic materials. The speed and products of the reactions can be varied to suit the application.

In a broad embodiment, this invention is a composition consisting of alternating layers of reactive substances and buffer materials, where each layer of reactive substance is capable of entering into a chemical reaction with another layer of reactive substance from which it is separated by a single layer of a buffer material, where said reactions are exothermic, and where each layer has a thickness of from about 10 to about 10,000 Angstroms.

DETAILED DESCRIPTION OF THE INVENTION

Figure 1:
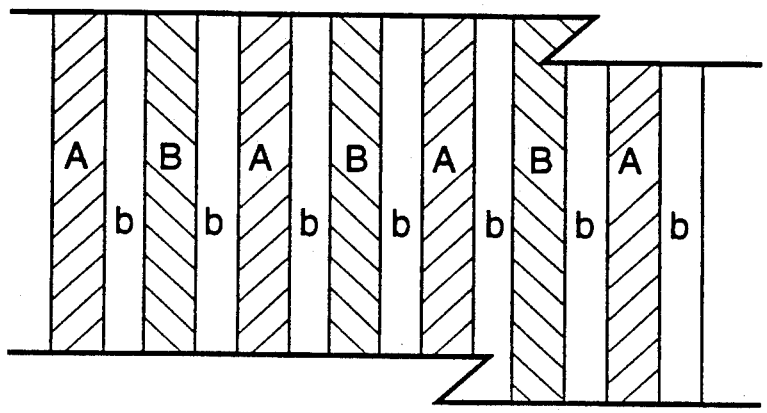
FIGS. 1 and 2 are schematic representations in the form of sections which depict the layered structure of the inventive composites.

In an inventive composition consisting of reactive substance A, reactive substance B which is different from reactive substance A, and buffer material b, the layers are arranged in the sequence AbBbAbBbAbBb etc., as shown in FIG. 1. Substances A and B are capable of reacting with one another in an exothermic reaction.

Figure 2:
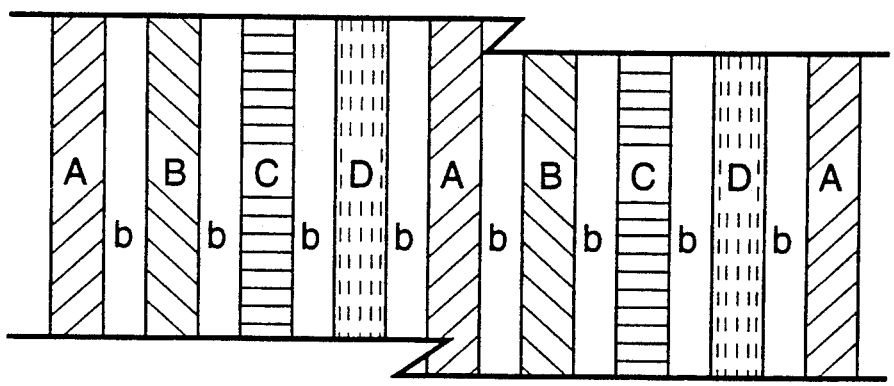

FIG. 2 shows an example in which four reactive substances are arranged in alternating pairs in the sequence AbBbCbDbAbBbCbDb etc., A and B are paired dissimilar reactive substances which will preferentially react with one another in an exothermic reaction, and C and D are paired dissimilar reactive substances which will preferentially react with one another in an exothermic reaction. Other reactions among A, B, C, and D may be possible, for example, between A and C, but the reactions between A and B and between C and D will take place in preference to the other reactions.

In another example, a composite may have layers in the sequence AbBbCbAbBBCb etc., where A reacts with B and the product of that reaction then reacts with C. The buffer layer between layers of A and layers of B ay be of a different substance than the B/C and C/A buffer layers in order to better provide for the delayed product/C reaction.

The compositions may be fabricated using thin film deposition techniques which are known to those skilled in the art; the layers may be sequentially deposited on a substrate. The thickness of each layer of reactive material and that of each layer of buffer material may range from about 10 Angstroms to about 10,000 Angstroms (0.001 to 1 micron). That the layers are thin is a key feature of the invention. In a single composition, the thickness of the layers may be a constant or some layers may have a different thickness than others. An inventive composition may consist of a single layer of each reactive substance separated by a layer of a buffer material or may consist of 100,000 or more layers of reactive substances and buffers. There is no inherent limit on the number of layers. One pair of reactive substances or multiple pairs of reactive substances may be used. Systems having three reactive substances may be designed. Normally, each layer will have a constant thickness, so that the layers are parallel to one another, but composites may be made having single layers which vary in thickness over the single layer. The layers need not be flat, that is, not parallel to a single plane, but may be curved. For example, multiple layers may be deposited on a sphere or other curved surface. In a single MIC, the buffer materials may be dissimilar in order to control the speeds of the reactions. The buffer material layers may be separately laid down or the buffer material may be formed by an initial reaction between two layers of reactive substance which involves only a small portion of the two reactive layers.

Based on experiments to date, it is expected that most inventive composites will utilize reactive substance layers having thicknesses in the range of from about 100 to about 2000 Angstroms. Also, most applications will probably use a number of layers ranging from about 100 to about 10,000. Where a buffer layer is formed by reaction between reactive substance layers, the buffer layer is expected to range from about 10 to about 100 Angstroms in thickness; otherwise the buffer thickness will probably be between about 10 and 1000 Angstroms.

The exothermic reaction of aluminum with cupric oxide (CuO) was identified as a model system for use in experimentation. The reasons for selecting these reactants include the ease with which these materials can be deposited on substrates using well-known thin film deposition techniques, that the reaction is reasonably exothermic, and that the atoms are relatively simple to model in theoretical calculations. The products of the reaction between these two substances is aluminum oxide, or alumina ($Al_2O_3$), and copper. The buffer forming reaction takes place as a layer of one reactant is being laid down upon the other. This system is self-buffering, that is, an initial reaction occurs between small portions of the reactants to form a buffer material layer of alumina and copper. The aluminum scavenges the oxygen with which it reacts from the cupric oxide layer, leaving behind copper. It is believed that the presence of copper does not contribute greatly; the primary buffer material is alumina.

A paper which provides the results of initial and preliminary characterization studies of layers of aluminum deposited on cupric oxide and the buffer forming reaction has been published by the American Vacuum Society. The paper also indicates techniques useful in studying the inventive composites. The paper is entitled "Reaction of Vapor-deposited Aluminum with Copper Oxides," (J. Vac. Sci. Technol., A 9 (3) May/June 1991, pages 1840-1846).

MICs were produced using an ultra-high vacuum dual magnetron sputter deposition system. Two magnetron sputter sources are arranged so that their output beams are orthogonal and directed toward a cylinder that is rotated by a stepper motor drive. Rotation of the cylinder alternately exposes a substrate mounted on the cylinder to each of the sputter sources. One sputter source contains a metallic aluminium target and the other a cupric oxide target. The sources are operated in the DC mode. Additional magnetron sputter sources can be added to this system to allow deposition of additional materials. There are many modern thin film deposition techniques which may be used to produce MICs. Physical vapor deposition methods include sputtering, evaporative coating, and laser ablation. Chemical vapor deposition techniques and electrochemical bath plating may be used. Large scale deposition systems such as those used for placing coatings on large panes of glass used in office buildings may be useful for producing large MICs.

In a typical fabrication of an MIC using magnetron sputtering deposition of reactants Al and CuO, the vacuum chamber is initially evacuated to about $10^{-7}$ torr to remove contaminant gas from the system. A working gas consisting of argon is then leaked into the system while the vacuum pump continues to run, resulting in a working pressure of about $5 \times 10^{-2}$ torr. This continuous argon purge removes gaseous contaminants from the chamber while deposition is taking place. To form a multilayer structure, a substrate is alternately positioned in front of each magnetron deposition source for a period of time; the longer the time, the thicker the layer. Typical operating parameters to form a structure having 100 Angstroms thick individual layers of Al and CuO are DC operation of both one inch diameter magnetron sources at a power level of 20 watts each and 23 seconds exposure time in front of each magnetron for each layer. Substrate to magnetron separation distance is typically 3 centimeters. The temperature of the substrate typically rises to 200 C. during the deposition process. Substrate cooling is unnecessary as long as the substrate is stable at 200 C. If temperature-sensitive substrates are used, active cooling of the substrate by water or liquid nitrogen may be required during deposition.

MICs may be fabricated by deposition on any convenient and appropriate substrate, such as Cu, Al, steel, glass, Teflon, Si, or KCl. If a particularly smooth surface is required, a cleaved crystal or single crystal silicon may be used. Substrates such as Mylar may be used if the substrate is cooled to prevent it from melting or otherwise degrading. MICs may be produced and then removed from the substrate. It should be noted that when working with Angstrom scale thin films, there is a great deal of variation in any particular film and thickness is often not uniform.

The reactions in MICs may be initiated by means of mechanical stress, exposure to an electron beam, a high voltage electrical discharge, a laser pulse, etc. Any method which disrupts the buffer layers may be used. It is not necessary to disrupt all buffer layers by an external mechanism as reaction of a pair of reactive layers will cause other layers to react. Thin films of the model system having a total of about 1000 reactant layers, each 100 Angstroms thick, and buffer layers formed during deposition were ignited by a gentle touch with a probe. Thicker composites (100 reactant layers, each 1000 Angstroms thick) required a hammer blow and even thicker MICs could not be started by a hammer blow. An electron beam (3 KeV energy, 10 $\mu A/mm^2$ current density) initiated reactions in a 100 layer MIC with 200 Angstrom layers, as did a 10 nanosecond laser pulse at a wave length of 1.064 micron wave length and an energy level of 50 millijoules. MICs can be designed to be more or less sensitive as needed in a particular application by varying layer thickness and which buffer material is used. In general, thin layer MICs are more sensitive than those having thick layers. The rate of reaction is also inversely proportional to individual layer thickness; the thicker the layers, the slower the reaction rate.

Figure 3:
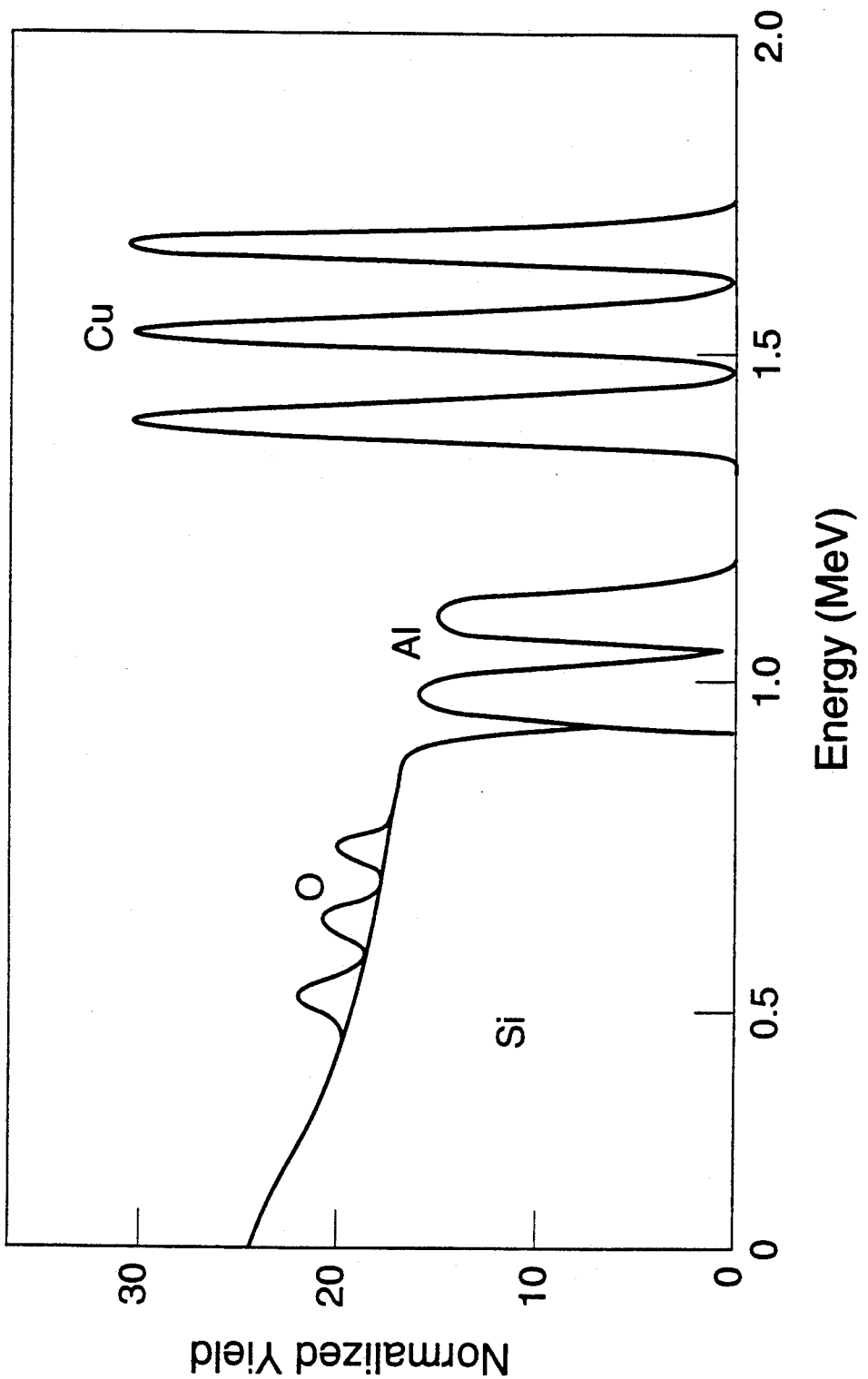
FIG. 3 is a re-drawn Rutherford backscattering spectrometry plot.

A number of methods have been used to study the inventive compositions, including powder x-ray diffraction, streak photography, time of flight mass spectrometry, and x-ray photoelectron spectroscopy. The temperature of MICs during reaction has been measured and found to be as high as 6000 K. Auger electron spectroscopy has been used to study MICs in the 2 to 20 Angstroms range while Rutherford backscattering spectrometry (RBS) has been used to look deeper into the composites. FIG. 3 shows the results of an RBS scan of a MIC, where the drawing was produced by visual observation and reproduction of an actual plot. The MIC which was investigated consisted of three layers of CuO with a thickness of 400 Angstroms and two 800 Angstroms Al layers. The buffer layer thickness was less than 20 Angstroms and was verified by x-ray diffraction. A backscatter angle of 60 degrees was used and the incident energy of the He ions was 2.182 MeV. The peaks due to Cu, Al, O, and the Si substrate are labelled.

The Table shows materials which are expected to be useful as reactive substances for MICs and the products of the reactions. The list of materials is not intended to be all-inclusive, but is simply a selection of potential reactions. Also shown are the estimated heats of reaction per gram of reactants, which were calculated by subtracting the heats of formation of the reactants from those of the products. Metals expected to be particularly useful include aluminum, titanium, and yttrium; these readily combine with oxygen to form a thin oxide layer. In choosing a reactant oxide, a compound with a low heat of formation is preferred.

TABLE

Estimated Heats of Reaction For Selected Reactions

| Reaction | kcal/g |
|---|---|
| $3\ Cu(ClO_4)_2 + 16\ Al \rightarrow 8\ Al_2O_3 + 3\ Cu + 3\ Cl_2$ | −2.5 |
| $Cu(NO_3)_2 + 4\ Al \rightarrow 2\ Al_2O_3 + Cu + N_2$ | −2.5 |
| $3\ CuO + 2\ Al \rightarrow Al_2O_3 + 3\ Cu$ | −1.0 |
| $Fe_2O_3 + 2\ Al \rightarrow Al_2O_3 + 2\ Fe$ | −1.0 |
| $Ca + S \rightarrow CaS$ | −1.6 |
| $Mg + CuO \rightarrow MgO + Cu$ | −1.0 |
| $TiF_4 + 2\ Ca \rightarrow 2\ CaF_2 + Ti$ | −0.9 |
| $2\ Na + S \rightarrow Na_2S$ | −1.1 |
| $Mg + S \rightarrow MgS$ | −1.5 |
| $TiF_4 + 4\ Li \rightarrow 4\ LiF + Ti$ | −1.2 |

An example of a system which is expected to produce large volumes of high temperature gas will use three reactant layers, Al, CuO, and an aluminum hydride trimethylamine adduct having the formula $AlH_3 \cdot N(CH_3)_3$. Alumina will be the buffer material between layers of all three reactant substances. Al and CuO will react and a sufficient amount of CuO will be used for the CuO to also react with the third component to form products including $Al_2O_3$, Cu, $H_2$, $N_2$, CO, and $CO_2$.

MICs will react to provide chemical energy in a vacuum, while submerged in water, in a reduced oxygen atmosphere, and in other environments in which other materials may be inoperative. MICs can be designed to produce a high energy pulse in a very short time period or a pulse which lasts a relatively long time but produces a lower energy peak. The type of energy release can be varied according to the application; for example, it may be only thermal or may be thermal with release of large quantities of gas. In addition to weapons and explosives applications, MICs will be useful in welding, forming, and heating metals and serving as a heat source where very high temperatures are required or where lower temperatures are needed for a period of time.

The scope of this invention is extremely broad. Any two materials which will react with one another in an exothermic reaction will serve as reactant substances. A buffer material may be any substance which prevents the adjacent reactive substances from reacting with one another and can be disrupted by an initiation mechanism. It is not necessary that a buffer material be capable of deposition by the methods discussed herein.

What is claimed is:

1. A composition consisting of layers of two reactive substances, which are aluminum and cupric oxide, and of a buffer material, where said layers are formed by thin film deposition, where each layer has a thickness of from about 10 to about 10,000 angstroms, where each layer of aluminum is separated from at least one layer of cupric oxide by a layer of buffer material, where each aluminum layer is prevented from exothermically reacting with a cupric oxide layer by the buffer layer separating them and reaction will occur upon disruption of the buffer layer, where each buffer layer is comprised of aluminum oxide and copper, and where each buffer layer is formed by means of reaction of aluminum and cupric oxide during deposition and the rate of deposition while a buffer layer is being formed is maintained at a sufficiently low value to avoid damaging previously deposited layers.

* * * * *